(12) United States Patent
Murakami (10) Patent No.: US 7,751,015 B2
(45) Date of Patent: Jul. 6, 2010

(54) PANEL MODULE FOR AN LCD MODULE HAVING INTER-SUBSTRATE FLEXIBLE WIRES

(75) Inventor: Masahiro Murakami, Kanagawa (JP)

(73) Assignee: NEC LCD Technologies, Ltd. (JP)

( * ) Notice: Subject to any disclaimer, the term of this patent is extended or adjusted under 35 U.S.C. 154(b) by 1140 days.

(21) Appl. No.: 10/987,872

(22) Filed: Nov. 12, 2004

(65) Prior Publication Data

US 2005/0105036 A1    May 19, 2005

(30) Foreign Application Priority Data

Nov. 14, 2003    (JP)    ............................... 2003-385250

(51) Int. Cl.
*G02F 1/1345*    (2006.01)
(52) U.S. Cl. ........................ 349/150; 349/149; 349/151; 349/152
(58) Field of Classification Search .................. 349/149, 349/150–152
See application file for complete search history.

(56) References Cited

U.S. PATENT DOCUMENTS

| | | | | |
|---|---|---|---|---|
| 5,889,572 A | * | 3/1999 | Takahashi et al. ........... | 349/149 |
| 5,978,060 A | | 11/1999 | Nakawaki et al. ........... | 349/150 |
| 6,052,171 A | * | 4/2000 | Kawaguchi .................. | 349/149 |
| 6,616,467 B2 | | 9/2003 | Ibaraki et al. ................ | 439/165 |

FOREIGN PATENT DOCUMENTS

| | | | |
|---|---|---|---|
| CN | 01144542.4 | | 7/2002 |
| EP | 1217699 | | 6/2002 |
| JP | 08-043844 | * | 2/1996 |
| JP | 8-43844 | | 2/1996 |
| JP | 9-120079 | | 5/1997 |
| JP | 9-203907 | | 8/1997 |
| JP | 11-038430 | | 2/1999 |
| JP | 2000-284311 | | 10/2000 |
| JP | 2001-033762 | | 2/2001 |
| JP | 2003-222897 | | 8/2003 |
| KR | 2000-66493 | | 11/2000 |

* cited by examiner

*Primary Examiner*—David Nelms
*Assistant Examiner*—Lauren Nguyen
(74) *Attorney, Agent, or Firm*—Hayes Soloway P.C.

(57) ABSTRACT

A panel module for an LCD device has an LCD panel including a TFT panel and a counter panel, signal line and scanning line drive boards for connecting to external circuits, and TCPs connecting together the TFT panel and the drive boards. The signal line driver TCP has a plurality of slits in the film substrate thereof and bent at the slits, allow the signal line drive board to be located on the rear side of the backlight unit of the LCD device. The panel module is suited any of stacked, L-shaped or U-shaped board structure.

10 Claims, 7 Drawing Sheets

PANEL MODULE FOR AN LCD MODULE HAVING INTER-SUBSTRATE FLEXIBLE WIRES

BACKGROUND OF THE INVENTION (a) Field of the Invention

The present invention relates to a panel module for an LCD (liquid crystal display) module and, more particularly, to a panel module including an LCD panel and a plurality of circuit boards attached thereto and used for an LCD module or an LCD device including the panel module and a backlight unit attached thereto.

(b) Description of the Related Art

Figure 7:
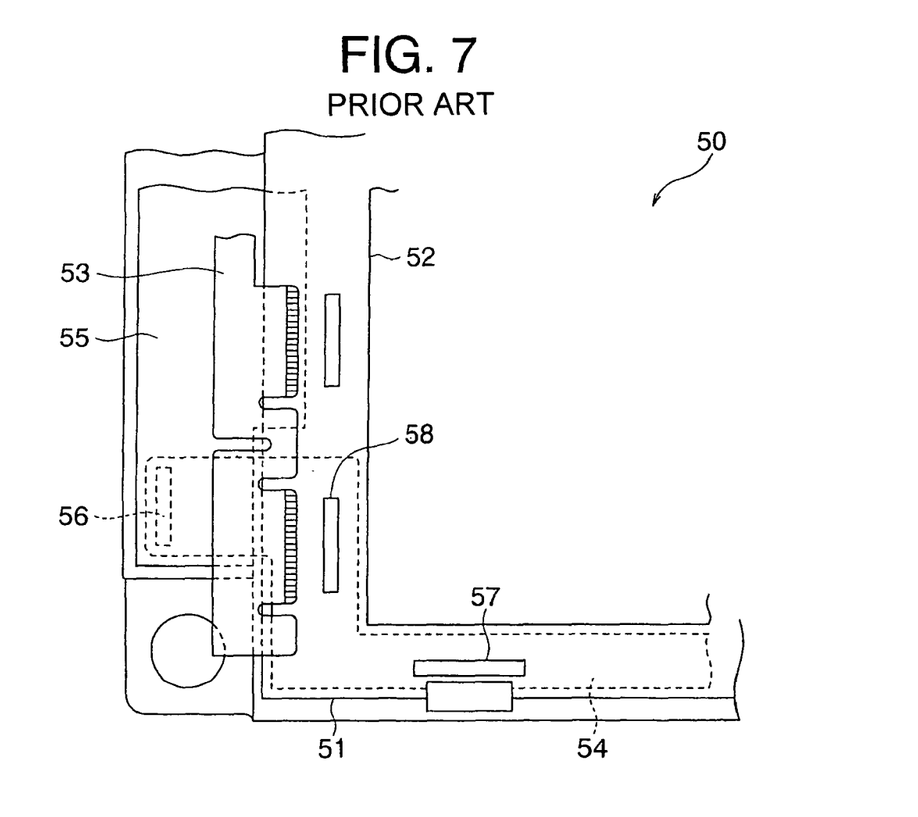
FIG. 7 is a partial top plan view of a conventional panel module.

LCD devices are increasingly used as flat-panel display units in computer systems as well as mobile data terminals and television sets, replacing conventional CRTs which have been used for a long time. FIG. 7 shows a partial top plan view of a conventional LCD device 50 having a panel module, described in Patent Publication JP-A-11-38430, including an LCD panel and a plurality of circuit boards, such as tape carrier packages (TCPs) 53 and 54 and terminal boards 55, attached thereto. The LCD panel includes a rear TFT substrate 51, a front counter substrate 52 having a somewhat smaller area and opposing the TFT substrate 51, and an LC layer (not specifically shown) sandwiched therebetween.

The terminal board 55 is disposed in the vicinity of the peripheral area of the TFT substrate 51, wherein the terminal board 55 and a plurality of signal line driver ICs 57 for driving the signal lines extending in the column direction of the TFT substrate 51 are electrically connected together via a flexible printed circuit board 54. The terminal board 55 and a plurality of scanning line driver ICs 58 for driving scanning lines extending in the row direction of the TFT substrate 51 are also connected together via a flexible printed circuit board 53 and a connector 56 disposed in the peripheral area of the TFT substrate 51.

More specifically, by using the flexible printed circuit boards 53 and 54, the signal line driver ICs 57 and 58 are connected to the external circuit (not shown) via the terminal board 55. In addition, part of the lines on the TFT substrate 51 is also connected to a backlight unit disposed at the rear side of the LCD panel. This type of LCD device is referred to as flat-type or stacked board structure, due to the TFT substrate 51 and the terminal board 55 being disposed within the same plane.

Figure 8:
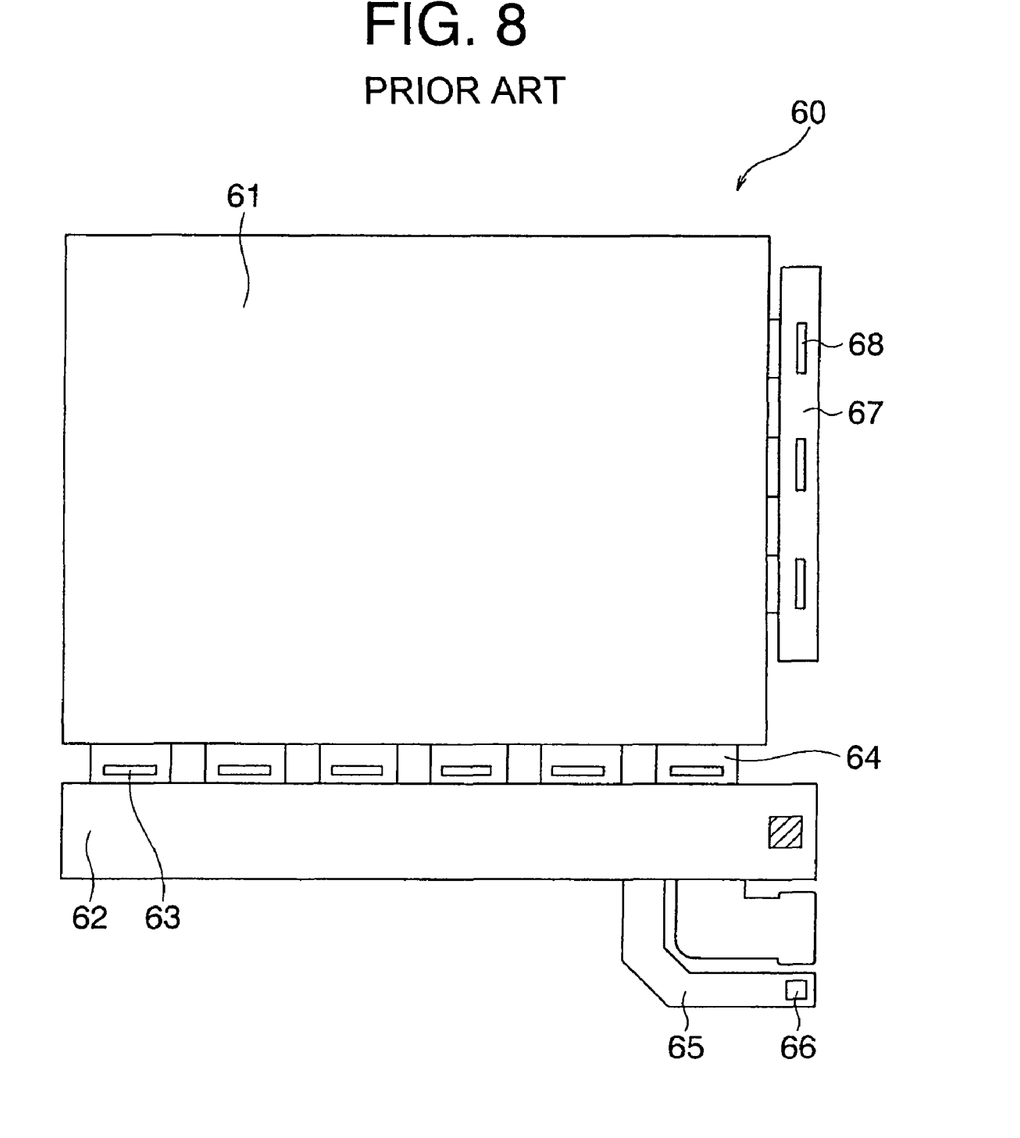
FIG. 8 is a top plan view of another conventional panel module.

FIG. 8 shows another type of panel module in an LCD device, described in JP-A-2000-284311, wherein a TFT substrate 61 and a control circuit substrate 62 having a function of the terminal board are connected together via a plurality of signal line driver TCPs 64 each mounting thereon a signal line driver IC 63. During fabricating the LCD device, TCPs 64 are bent onto the rear side of the LCD panel after connecting the TCPs 64 to the TFT substrate 61 and mounting the backlight unit on the rear side of the LCD panel, thereby allowing the control circuit board 62 to be disposed on the rear side of the backlight unit of the LCD device.

Another circuit board 67 mounting thereon scanning line driver ICs 68 is connected to the control circuit board 62 via a connector 66 and a flexible cable 65 attached to the control circuit board 62. The panel module 60 of FIG. 8 has a reduced planar area by disposing the control circuit board 62 on the rear side of the backlight unit while using U-shaped circuit boards.

Another LCD device including a panel module having L-shaped circuit boards is also known wherein the control circuit boards extend normal to the screen of the LCD panel.

Development of fabrication techniques of the LCD devices allows modules of different parts to be more frequently used in the LCD device, in view that these parts of the LCD device are generally fabricated by different manufactures or different divisions in the manufacture and thus should be efficiently carried between these manufactures or divisions. Examples of these modules include an LCD panel wherein a TFT substrate and a counter substrate mounting thereon color filters are assembled with an LC layer sandwiched therebetween, a panel module wherein the TFT substrate in the LCD panel is attached with a plurality of circuit boards such as driver TCPs and terminal boards, a backlight unit or backlight module wherein a plurality of lamps and a plurality of optical sheets are assembled within a chassis, and an LCD module wherein the panel module is attached with the backlight unit. It is to be noted that the panel modules are manufactured to be used for respective types of LCD devices and dedicated to respective LCD devices each having a stacked, L-shaped or U-shaped structure.

As will be understood from the above descriptions, the panel modules described in those patent publications are dedicated to respective types of the LCD devices, and accordingly, the panel modules and LCD modules are manufactured as dedicated modules, which are dedicated to respective types of the LCD devices.

Although the LCD panels and panel modules are manufactured for the respective types of the LCD modules, manufacture of the dedicated LCD panels and dedicated panel modules for respective types of the LCD devices raises the costs for the LCD panels and panel modules. Thus, common panel modules and common LCD modules are desired which are adapted to all the types of the LCD devices having respective arrangements of the circuit boards.

In addition, some LCD device manufacturers receive the panel modules from the manufacturer of the panel modules, assemble the LCD devices by attaching thereto the backlight units and sell the resultant LCD devices as their own products. In such a case, the manufacturer of the panel modules must prepare different panel modules adapted to the respective types of the LCD devices requested by the LCD device manufactures, which restricts the design choice in the manufacturer of the panel modules.

In particular, for disassembling the backlight unit from the panel module in the LCD device having the panel module of FIG. 8, it is generally necessary to straighten the bends of the TCPs and disconnect the interconnect lines between the control circuit board and the scanning line driver ICs before disassembling the backlight unit. Thus, if the backlight unit is to be disassembled from the panel module during a product test of the LCD module or LCD device, the function of the driver ICs cannot be examined while observing the image display On the LCD device.

SUMMARY OF THE INVENTION

In view of the above problems of the conventional techniques, it is an object of the present invention to provide a panel module for an LCD module, which is capable of being manufactured in common to a plurality of types of LCD devices having different arrangements of the circuit boards, and adapted to a product test while disassembling the backlight unit from the panel module.

The present invention provides a panel module for use in an LCD device, including: first and second substrates sandwiching therebetween a liquid crystal layer, the second substrate mounting thereon an array of switching elements each for driving a corresponding pixel, and a plurality of signal lines and a plurality of scanning lines for transmitting data signals and selecting signals, respectively, to the switching elements; a signal line driver TCP (tape carrier package) and a scanning line driver TCP each for driving the signal lines and the scanning lines, respectively; a signal line driver substrate connected to the signal line driver TCP and supported by the second substrate via the signal line driver TCP; a scanning line driver substrate connected to the scanning line driver TCP and supported by the second substrate via the scanning line driver TCP; and inter-substrate flexible wires for connecting together the signal line driver TCP and the scanning line driver TCP, at least one TCP of the signal line driver TCP and the scanning line driver TCP having a bendable structure, wherein the at least one TCP allows a corresponding at least one of the signal line driver substrate and the scanning line driver substrate to be located at a rear side of the second substrate upon bending of the at least one TCP.

The present invention also provides an LCD module including the panel module of the present invention as described above and a backlight unit disposed at a rear side of the panel module.

In accordance with the panel module of the present invention as well as the panel module in the LCD module of the present invention, the arrangement of the at least one TCP and a corresponding driver substrate allows the panel module to be suited to any type of the stacked structure, L-shaped structure or U-shaped structure of the circuit boards, allowing a product test of the panel module or LCD device to be effected while disassembling a backlight unit from the panel module.

The above and other objects, features and advantages of the present invention will be more apparent from the following description, referring to the accompanying drawings.

PREFERRED EMBODIMENT OF THE INVENTION

Now, the present invention is more specifically described with reference to accompanying drawings, wherein similar constituent elements are designated by similar reference numerals throughout the drawings.

Figure 1:
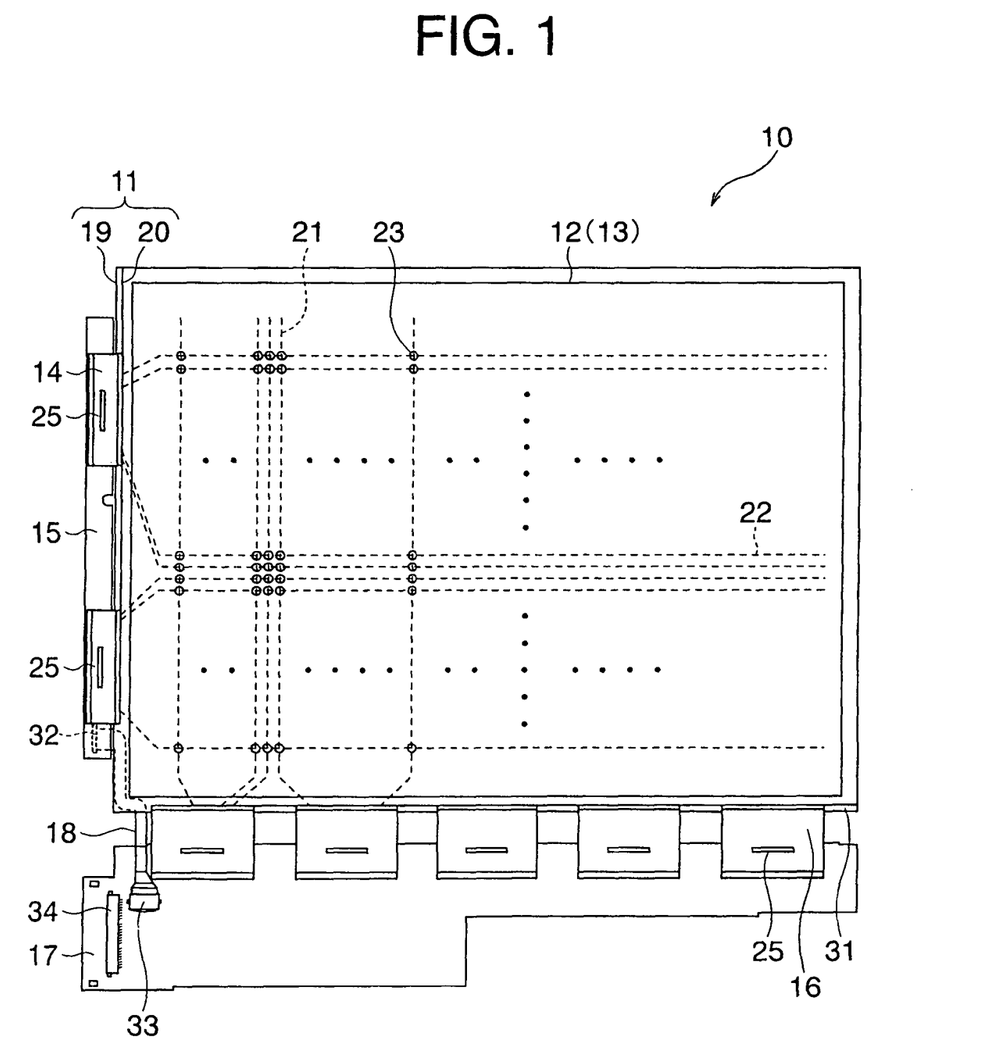
FIG. 1 is a top plan view of a panel module according to a first embodiment of the present invention.

Referring to FIG. 1, a panel module, generally designated by numeral 10, according to a first embodiment of the present invention includes an LCD panel 11 having therein an LC layer, a pair of polarizing plates 12 and 13 sandwiching therebetween the LCD panel 11, a scanning line driver substrate (terminal substrate) 15 supported at the left edge of the LCD panel 11 via a plurality of scanning line driver TCPs 14 and electrically connected thereto, a signal line driver substrate (terminal substrate) 17 supported at the bottom edge of the LCD panel 11 via a plurality of signal line driver TCPs 16 and electrically connected thereto, and inter-substrate flexible harness 18 for connecting together the scanning line driver substrate 15 and the signal line driver substrate 17. The polarizing plates 12 and 13 have a somewhat smaller area than the LCD panel 11.

The LCD panel 11 includes a TFT substrate 19 and a counter substrate 20 sandwiching therebetween the LC layer, the TFT substrate 19 having a somewhat larger area than the counter substrate 20, the latter having a somewhat larger area than the polarizing plates 12 and 13, The TFT substrate 19 mounts thereon a plurality of signal lines 21 extending in the column direction for transmitting image signals therethrough, and a plurality of scanning lines 22 extending in the row direction for transmitting scanning signals therethrough. A plurality of pixels 23 are formed On the respective intersections between the signal lines 21 and the scanning lines 22. Each pixel 23 includes a pixel electrode and a TFT (thin film transistor) activated by a corresponding scanning signal to transmit a corresponding image signal to the pixel electrode. The pixel electrode and a counter electrode formed on the TFT substrate and counter substrate, respectively, control the LC molecules in the pixel area of the LC layer, thereby representing an image on the screen of the LCD panel 11.

The signal line driver TCP 16 is disposed, adjacent to the bottom edge of the LCD module 11, to drive a corresponding group of the signal lines 21. The scanning line driver TCP 14 is disposed, adjacent to the left edge of the LCD module 11, to drive a corresponding group of the scanning lines 22.

Figure 2:
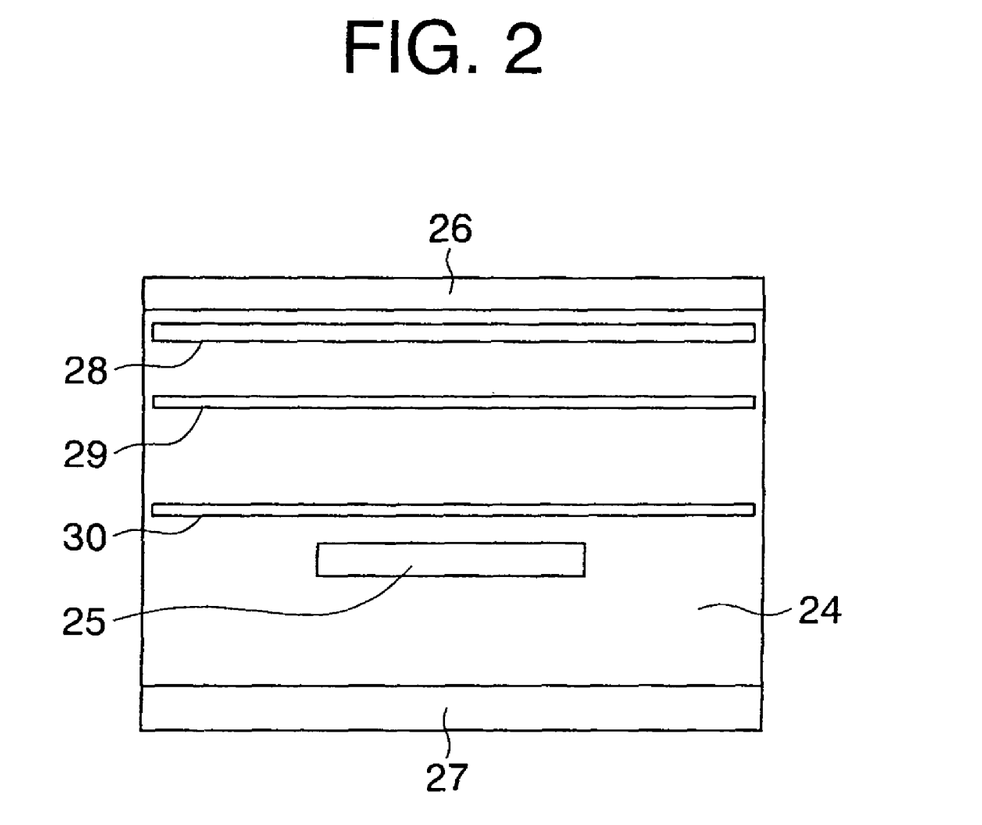
FIG. 2 is a top plan view of the TCP and the vicinity thereof in the panel module of FIG. 1.

Referring to FIG. 2, the signal line driver TCP 16 includes a film substrate 24 made of plastics such as polyimide, a signal line driver IC 25 mounted on the film substrate 24, a plurality of interconnect lines (not shown) formed on the film substrate 24, terminals 26 for connecting interconnect lines on the film substrate 26 to the signal lines 21 on the TFT substrate 19, and terminals 27 for connecting the interconnect lines on the film substrate 24 to the signal lines on the signal line driver substrate 17. The film substrate 24 has therein a plurality of slits 28, 29 and 30 extending parallel to the corresponding edge of the TFT substrate 19. Each slit 28, 29 or 30 allows the film substrate 24 to be bent at the each slit. The structure of the scanning line driver TCP 14 is similar to that of the signal line driver TCP 16 except that the film substrate of the scanning signal driver TCP 14 has no slit therein.

Figure 3A:
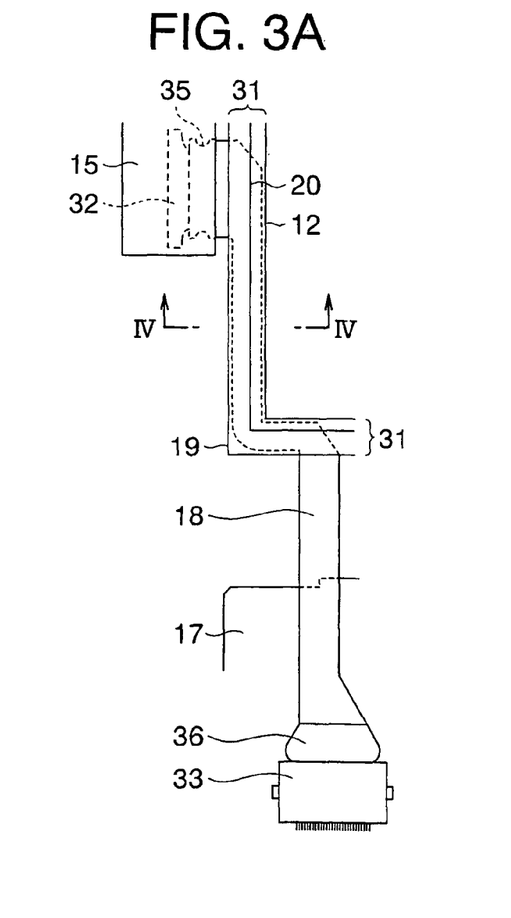
FIGS. 3A and 3B are a top plan view and a bottom view of interconnect lines and the vicinity thereof, respectively, of the panel module of FIG. 1.
Figure 3B:
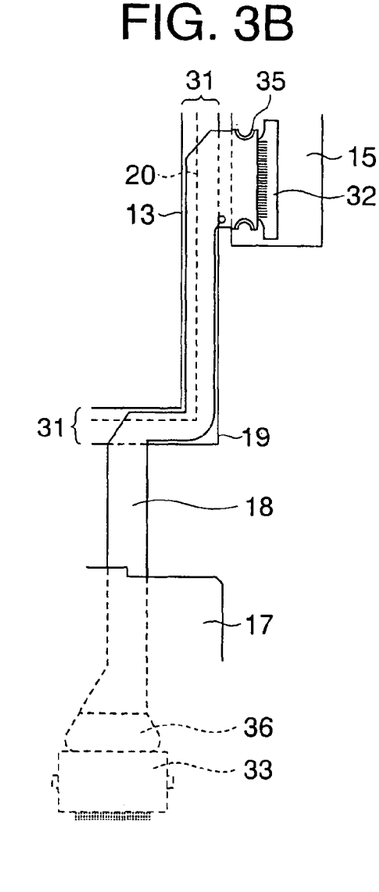

FIGS. 3A and 3B show the inter-substrate harness 18, which extends on the peripheral area 31 of the TFT substrate 19 for connecting together the interconnect lines on the scanning line driver substrate 15 and the interconnect lines on the signal line driver substrate 17 via flexible wires of the flat harness 18. The scanning line driver substrate 15 has, on the rear surface thereof, a connector 32 attached onto the ends of the interconnect lines on the scanning line driver substrate 15, whereas the signal line driver substrate 17 has, on the front surface thereof, a connector 33 attached onto the ends of the interconnect lines on the signal line driver substrate 17.

The inter-substrate harness 18 includes plugs 35 and 36 on both ends of the flat harness 18, the plugs being coupled to the connectors 32 and 33, respectively, to connect together the interconnect lines on both the scanning line driver substrate 15 and the signal line driver substrate 17. The flat harness 18 is bent several times within the same plane and adapted to pass along the periphery of the TFT substrate 19 on the peripheral area 31. The flat harness 18 passes, after passing on the peripheral area 31 of the TFT substrate 19, through the gap between the TFT substrate 19 and the signal line driver substrate 17 from the rear side to the front side of the LCD panel 11.

By using the flat harness 18 instead of interconnect lines patterned on the TFT substrate 19 etc., each inter-substrate wire has a larger cross-sectional area and thus is suited as a power source line. The arrangement of the inter-substrate harness 18 on the peripheral area 31 of the TFT substrate 19 prevents degradation of the image quality of the LCD panel 11.

Figure 4:
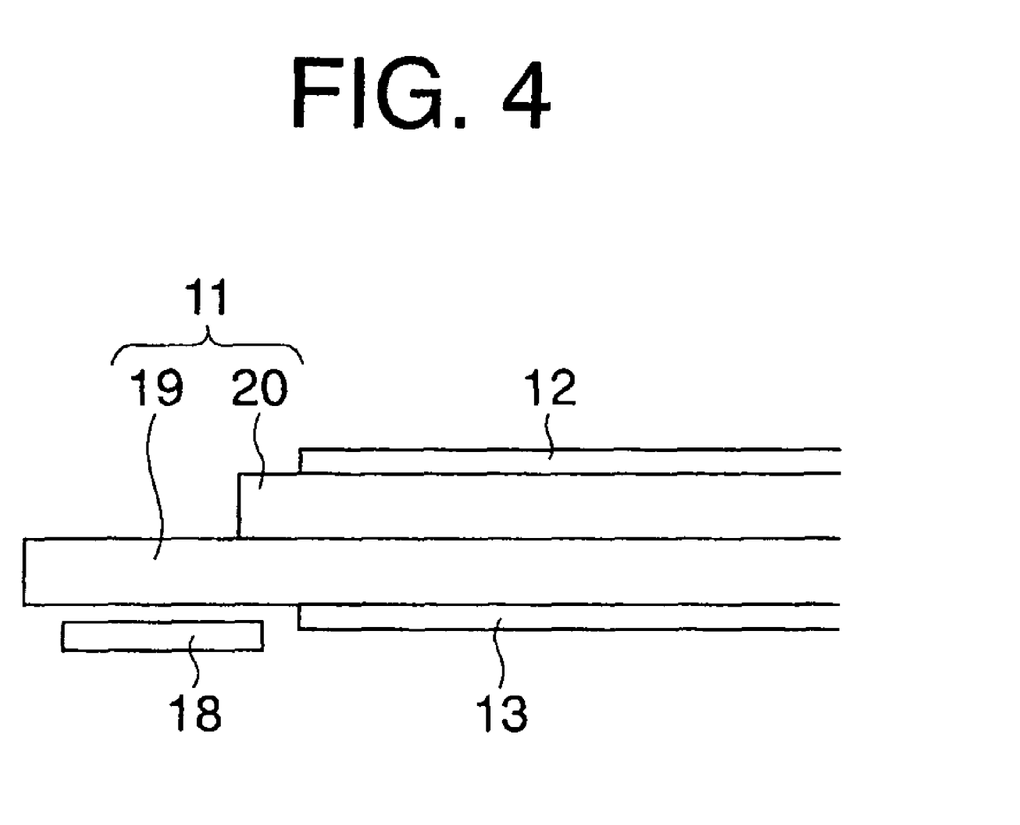
FIG. 4 is a sectional view taken along line IV-IV in FIG. 3A.

FIG. 4 shows the sectional view of the inter-substrate harness 18 taken along line IV-IV in FIG. 3. The inter-substrate harness 18 is supported on the rear side of the peripheral area 31 of the TFT substrate 19, wherein the inner edge of the inter-substrate harness 18 is substantially aligned with the periphery of the counter substrate 20 as viewed normal to the LCD panel 11. Each of the polarizing plates 12 and 13 has a cut-out corresponding to the location of the inter-substrate harness 18, The inter-substrate harness 18 has, for example, a thickness of 0.2 mm which is similar to the thickness of the polarizing plate 13. The TFT substrate 19 may have a groove for receiving therein the inter-substrate harness 18.

Figure 5:
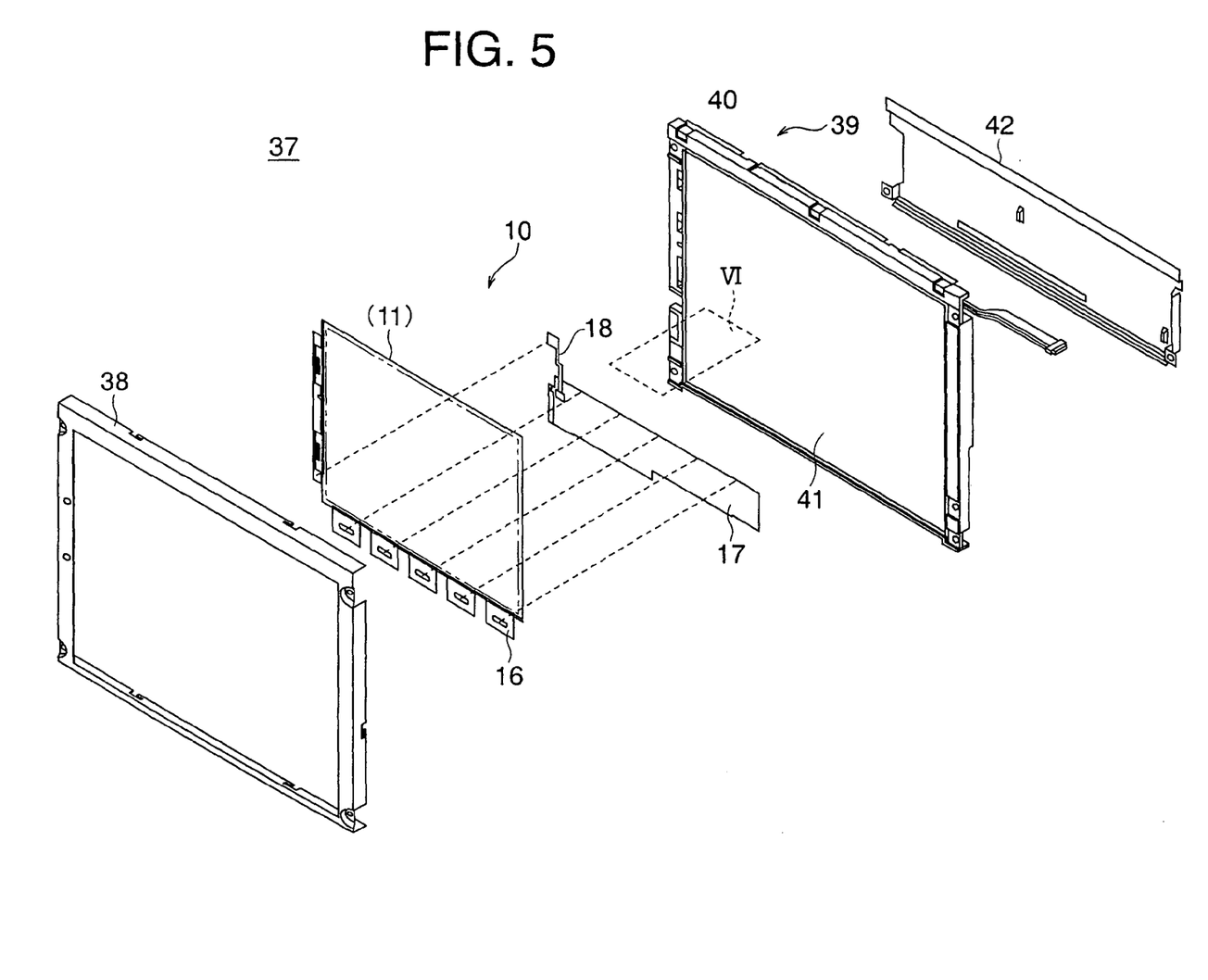
FIG. 5 is a perspective exploded view of an LCD module including the panel module of FIG. 1.

FIG. 5 shows an LCD module including the panel module 10 of the above embodiment in an exploded view thereof The LCD module, generally designated by numeral 37, includes an outer frame 38 disposed in the front side of the panel module 10 for fixing the edge thereof, and a backlight unit 39 disposed in the rear side of the panel module 10 for providing backlight to the LCD panel 11 of the panel module 10. The backlight unit 39 includes a plurality of lamps (not shown), a backlight chassis 40 having edges supporting the lamps thereon, a plurality of stacked optical sheets for irradiating through the LCD panel 11, and a rear cover 42 attached onto the rear side of the backlight chassis 40.

For fabricating the panel module 10, the top edge of the signal line driver substrate 17 attached with the inter-substrate harness 18 is aligned with the bottom edges of the signal line driver TCPs 16, followed by attaching the signal line driver substrate 17 onto the rear surface of the LCD panel 11 and bonding the signal lines onto the terminals of the signal line driver TCPs 16.

For fabricating the LCD module 37, the resultant panel module 10 is sandwiched between the outer frame 38 and backlight unit 39, followed by fixing together the outer frame 38 and the backlight unit 39 by screws. Thereafter, the signal line driver TCPs 16 are bent twice to locate the signal line driver substrate 17 on the rear side of the backlight chassis 40. The signal line driver substrate 17 is protected by the rear cover 42 attached onto the backlight chassis 40. It is to be noted that the external terminals 34 of the signal line driver substrate 17 is exposed from the cut-out side edge of the rear cover 42.

Figure 6:
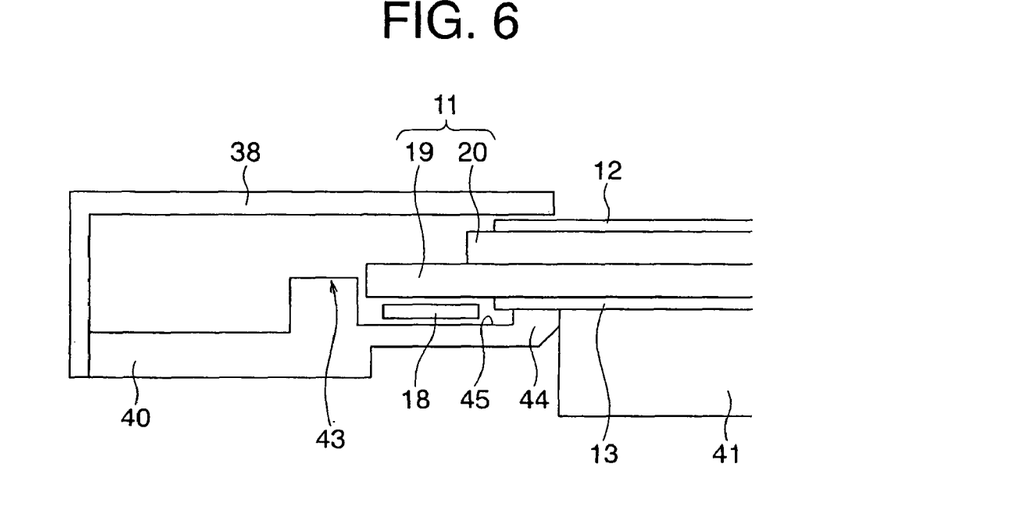
FIG. 6 is a sectional view taken along a plane VI in FIG. 5.

FIG. 6 shows a partial sectional view of the LCD module 10 shown in FIG. 5 taken along the plane VI shown in FIG. 5. The LCD panel 11 is sandwiched and fixed between the outer frame 38 and the backlight chassis 40. The backlight chassis 40 includes a body, a stopper 43 projecting therefrom toward the front side for positioning the outer periphery of the TFT substrate 19, and an inner edge 44 for thrusting the rear polarizing plate 13 against the rear side of the TFT substrate 19. The inter-substrate harness 18 is received within the groove 45 formed between the stopper 43 and the inner edge of the backlight chassis 40. An optical guide plate 41 of the backlight unit 39 is disposed on the rear side of the rear polarizing plate 13 for providing backlight to the TFT substrate 19 through the rear polarizing plate 13.

According to the panel module 10 of the present embodiment, since the inter-substrate harness 18 includes flexible wires for connecting together interconnect lines on the scanning line driver substrate 15 and interconnect lines on the signal line driver substrate 17, the signal line driver substrate 17 can be disposed on either the front side or the rear side of the TFT substrate 19 or normal to the TFT substrate 19 depending on the design of the LCD module 37.

More specifically, the panel module 10 of the present embodiment can be suited to any of the stacked board structure, L-shaped board structure or U-shaped board structure for the LCD module. The arrangement of the inter-substrate harness 18 on the peripheral area 31 of the TFT substrate 19 saves the space for the LCD panel 11. Since the backlight unit 39 can be disassembled from the panel module 10 while activating the panel module 10 for image display, the panel module 10 can be tested with ease while disassembling the backlight unit 39 therefrom.

It is to be noted that the slits 28, 29 and 30 formed in the film substrate 24 are not indispensable since the film substrate 24 can be bent for a total of 180 degrees without the slit or slits. In addition, the inter-substrate harness 18 need not be disposed in the groove of the backlight chassis 40, and may be disposed in the groove formed on the TFT substrate 19, or disposed in the grooves formed on the backlight chassis 40 and the TFT substrate 19.

Moreover, the scanning line driver substrate 15 may be provided with slits similar to the slits in the signal line driver substrate 17. In this case, the scanning line driver substrate 15 can be suited to any of the stacked board structure, L-shaped board structure or U-shaped board structure. The signal line driver substrate 17 (or scanning line driver substrate 15) may be disposed On either or both of top and bottom edges (left and right edges) of the TFT substrate 19, and may be terminal boards or control circuit boards each including a driver IC.

The inter-substrate harness 18 may be replaced by flexible wires which are connected to the driver substrates 15 and 17 via an anisotropic conductive film, solder bonding or heat-press bonding. The inter-substrate harness or wires may be disposed on the surface or groove of the TFT substrate 19 with or without fixing thereto. If fixing is employed, fixing by using adhesive, double-stick tape or clip may be used. The double-stick tape may be detachable. The inter-substrate harness 18 may be formed in advance as an L-shaped harness. In this case, both the signal line driver substrate 17 and the scanning line driver substrate 15 may be disposed on the rear side of the LCD panel 11.

Since the above embodiments are described only for examples, the present invention is not limited to the above embodiments and various modifications or alterations can be easily made therefrom by those skilled in the art without departing from the scope of the present invention.

What is claimed is:

1. A panel module for use in an LCD (liquid crystal display) device, comprising:
   first and second substrates sandwiching therebetween a liquid crystal layer, said second substrate having mounted thereon an array of switching elements each for driving a corresponding pixel, and a plurality of signal lines and a plurality of scanning lines for transmitting data signals and selecting signals, respectively, to said switching elements;
   a signal line driver TCP (tape carrier package) and a scanning line driver TCP each for driving said signal lines and said scanning lines, respectively;

a signal line driver substrate connected to said signal line driver TCP and supported by said second substrate via said signal line driver TCP;

a scanning line driver substrate connected to said scanning line driver TCP and supported by said second substrate via said scanning line driver TCP; and at least one TCP of said signal line driver TCP and said scanning line driver TCP having a bendable structure, wherein said at least one TCP allows a corresponding at least one of said signal line driver substrate and said scanning line driver substrate to be located at a rear side of said second substrate upon bending of said at least one TCP, inter-substrate flexible wires for connecting together said signal line driver substrate and said scanning line driver substrate, having at least one connecting wire having a first portion, a second portion and an intermediate portion intermediate said first and second portions, and, in a pre-assembled configuration, lying generally in the same plane, and in an assembled position, lying generally in the same plane, said first portion lying in a rear side of said scanning line driver substrate and said second portion lying in a front side of said signal line driver substrate, with said intermediate portion traversing between said rear side and said front side.

2. The panel module according to claim 1, wherein said at least one TCP has a plurality of slits extending parallel to one another, and is bendable at said slits.

3. The panel module according to claim 1, wherein said inter-substrate flexible wires are supported on said second substrate except for both end portions of said inter-substrate flexible wires.

4. The panel module according to claim 3, wherein said first substrate has a smaller area than said second substrate, and said inter-substrate flexible wires are supported on a peripheral area of said first substrate.

5. The panel module according to claim 1, wherein said inter-substrate flexible wires are formed as a wire harness including a pair of plugs at both ends of said wire harness.

6. An LCD (liquid crystal display) module for use in an LCD device, comprising a panel module and a backlight unit disposed at a rear side of said panel module, said panel module comprising:

first and second substrates sandwiching therebetween a liquid crystal layer, said second substrate having mounted thereon an array of switching elements each for driving a corresponding pixel, and a plurality of signal lines and a plurality of scanning lines for transmitting data signals and selecting signals, respectively, to said switching elements;

a signal line driver TCP (tape carrier package) and a scanning line driver TCP each for driving said signal lines and said scanning lines, respectively;

a signal line driver substrate connected to said signal line driver TCP and supported by said second substrate via said signal line driver TCP;

a scanning line driver substrate connected to said scanning line driver TCP and supported by said second substrate via said scanning line driver TCP; and at least one TCP of said signal line driver TCP and said scanning line driver TCP having a bendable structure, wherein said at least one TCP allows a corresponding at least one of said signal line driver substrate and said scanning line driver substrate to be located at a rear side of said backlight unit upon bending of said at least one TCP, inter-substrate flexible wires for connecting together said signal line driver substrate and said scanning line driver substrate, having at least one connecting wire having a first portion, a second portion and an intermediate portion intermediate said first and second portions, and, in a pre-assembled configuration, lying generally in the same plane, and in an assembled position, lying generally in the same plane, said first portion lying in a rear side of said scanning line driver substrate and said second portion lying in a front side of said signal line driver substrate, with said intermediate portion traversing between said rear side and said front side.

7. The LCD module according to claim 6, wherein at least one of said second substrate and said backlight unit has a groove for receiving said inter-substrate flexible wires.

8. The LCD module according to claim 6, wherein said inter-substrate flexible wires are formed as a wire harness including a pair of plugs at both ends of said wire harness.

9. The panel module according to claim 1 further comprising:

the at least one connecting wire, in an unassembled configuration, extending in a first direction and, in an assembled configuration, extending partly in the first direction and then folded back in a second direction opposite to the first direction.

10. The panel module according to claim 6 further comprising:

the at least one connecting wire, in an unassembled configuration, extending in a first direction and, in an assembled configuration, extending partly in the first direction and then folded back in a second direction opposite to the first direction.

* * * * *